United States Patent
Mazzillo et al.

(10) Patent No.: US 11,171,255 B2
(45) Date of Patent: Nov. 9, 2021

(54) HIGH SENSITIVITY OPTOELECTRONIC DEVICE FOR DETECTING CHEMICAL SPECIES AND RELATED MANUFACTURING METHOD

(71) Applicant: STMICROELECTRONICS S.R.L., Agrate Brianza (IT)

(72) Inventors: Massimo Cataldo Mazzillo, Corato (IT); Giovanni Condorelli, Catania (IT); Lucio Renna, Acireale (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 274 days.

(21) Appl. No.: 16/386,170

(22) Filed: Apr. 16, 2019

(65) Prior Publication Data

US 2019/0319159 A1 Oct. 17, 2019

(30) Foreign Application Priority Data

Apr. 17, 2018 (IT) .................. 102018000004621

(51) Int. Cl.
*H01L 31/14* (2006.01)
*H01L 27/144* (2006.01)
(Continued)

(52) U.S. Cl.
CPC .............. *H01L 31/145* (2013.01); *G01J 1/44* (2013.01); *H01L 27/1446* (2013.01);
(Continued)

(58) Field of Classification Search
CPC . H01L 31/145; H01L 27/1446; H01L 31/024; H01L 31/035281; H01L 31/107;
(Continued)

(56) References Cited

U.S. PATENT DOCUMENTS 5,032,729 A * 7/1991 Charpak ................... G01T 1/28
250/385.1
5,434,442 A 7/1995 Lesk et al.
(Continued)

FOREIGN PATENT DOCUMENTS

JP 7-221341 A 8/1995
JP 8-82612 A 3/1996
(Continued)

OTHER PUBLICATIONS

Alphasense Application Note, "p-type Metal Oxide Sensor Overview and Interface Circuit," AAN 601-03, Alphasense Ltd., Jan. 2019, 4 pages.

(Continued)

*Primary Examiner* — Georgia Y Epps
*Assistant Examiner* — Don J Williams
(74) *Attorney, Agent, or Firm* — Seed IP Law Group LLP

(57) ABSTRACT

A device for detecting a chemical species including a Geiger mode avalanche photodiode, which comprises a body of semiconductor material delimited by a front surface. The semiconductor body includes: a cathode region having a first type of conductivity, which forms the front surface; and an anode region having a second type of conductivity, which extends within the cathode region starting from the front surface. The detection device further includes: a dielectric region, which extends on the front surface; and a sensitive region, which is arranged on top of the dielectric region and electrically coupled to the anode region and has a resistance that depends upon the concentration of the chemical species.

20 Claims, 12 Drawing Sheets

(51) Int. Cl.
  *H01L 31/024* (2014.01)
  *H01L 31/0352* (2006.01)
  *H01L 31/107* (2006.01)
  *G01J 1/44* (2006.01)
  *H01L 31/18* (2006.01)
  *G01J 1/42* (2006.01)

(52) U.S. Cl.
  CPC .... *H01L 31/024* (2013.01); *H01L 31/035281* (2013.01); *H01L 31/107* (2013.01); *H01L 31/1864* (2013.01); *G01J 2001/4295* (2013.01); *G01J 2001/442* (2013.01); *G01J 2001/448* (2013.01); *G01J 2001/4466* (2013.01)

(58) Field of Classification Search
  CPC .......... H01L 31/1864; G01J 2001/4295; G01J 2001/442; G01J 2001/4466; G01J 2001/448
  See application file for complete search history.

(56) References Cited

U.S. PATENT DOCUMENTS

| | | | |
|---|---|---|---|
| 5,759,367 | A | 6/1998 | Matsuura et al. |
| 9,728,667 | B1 * | 8/2017 | Johnson .............. H01L 27/1446 |
| 9,799,757 | B2 | 10/2017 | Gridelet et al. |
| 2006/0118903 | A1 | 6/2006 | Cahen et al. |
| 2008/0156993 | A1 | 7/2008 | Weinberg et al. |
| 2009/0114819 | A1 | 5/2009 | Yamanaka et al. |
| 2009/0184317 | A1 | 7/2009 | Sanfilippo et al. |
| 2010/0065744 | A1 | 3/2010 | Ouvrier-Buffet |
| 2010/0102242 | A1 | 4/2010 | Burr et al. |
| 2011/0241149 | A1 | 10/2011 | Mazzillo et al. |
| 2012/0139074 | A1 | 6/2012 | Abe |
| 2012/0153423 | A1 | 6/2012 | Lee |
| 2014/0231951 | A1 | 8/2014 | Yoon et al. |
| 2014/0234981 | A1 | 8/2014 | Zarkesh-Ha et al. |
| 2016/0216227 | A1 | 7/2016 | Boni |
| 2016/0282259 | A1 | 9/2016 | Kolb et al. |
| 2017/0314989 | A1 | 11/2017 | Mazzillo et al. |
| 2018/0033895 | A1 | 2/2018 | Mazzillo et al. |

FOREIGN PATENT DOCUMENTS

| | | |
|---|---|---|
| JP | 8-330558 A | 12/1996 |
| JP | 3349012 B2 | 11/2002 |
| JP | 2009-258000 A | 11/2009 |
| JP | 2014-132241 A | 5/2019 |
| KR | 10-1763865 B1 | 8/2017 |

OTHER PUBLICATIONS

Figaro, "Non-Dispersive Infra-Red (NDIR) $CO_2$ Sensor," published online 2018, downloaded on May 23, 2019 from https://www.figaro.co.jp/en/product/feature/cdm7160.html, 6 pages.
Fox et al., "MEMS and Sensors: Environment and Health Sensors in Mobile Devices," *IHS Technology Report*, 2017, 95 pages.
Hamamatsu Photonics K. K., "Mini-spectrometer [Micro series] C12666MA" product specifications datasheet, Catalog No. KACC1216E10, Jan. 2019, 11 pages.
Korotcenkov, "Metal oxides for solid-state gas sensors: What determines our choice?," *Materials Science and Engineering B* 139:1-23, 2007.
Sensirion, "Datasheet SGPC3 Sensirion Gas Platform," product specifications datasheet, Version 0.91, Feb. 2018, 16 pages.
Soundarrajan, "Achieving the Potential of Nano Gas Sensors," published online Sep. 1, 2006, downloaded from https://www.sensorsmag.com/components/achieving-potential-nano-gas-sensors, 4 pages.
Das et al., "Design and fabrication of low power polysilicon sources," Solid-State Electronics 43:12399-1244, 1999.
Laconte et al. (ed), Micromachined Thin-Film Sensors for SOI-CMOS Co-Integration, Springer, Dordrecht, The Netherlands, 2006, 291 pages.
Laskovski (ed), Biomedical Engineering, Trends in Electronics, InTech, London, UK, 2011, Chapter 16, Gao et al., "Integrated High-Resolution Multi-Channel Time-to-Digital Converters (TDCs) for PET Imaging," pp. 295-316 (24 pages.).
McConnell et al., "Thermal Conductivity of Doped Polysilicon Layers," Journal of Microelectromechanical Systems 10(3):360-369, 2001.
Tisa et al., "Electronics for single photon avalanche diode arrays," Sensors and Actuators A 140:113-122, 2007.
Zappa et al., "Principles and features of single-photon avalanche diode arrays," Sensors and Actuators A 140:103-112, 2007.
"Flame Tracker* Flame Tracker Improves Performance and Availability of Your Gas Turbine," GE Measurement & Control, 2015.
"High Performance Low Cost Flame Detection," Spectrex INC. SharpEye™ 20/20M "Mini" Flame Detection Series, 8 pages, 2014.
"Model FL4000H Multi-Spectral Infrared Flame Detector," General Monitors by MSA, 72 pages.
"Quick Detection of Flame from Distance, Compact Uv Sensor with High Sensitivity and Wide Directivity Suitable for Flame Detectors and Fire Alarms," Hamamatsu Flame Sensor UVTRON® R2868, 2 pages, 2014.
"UV Flame Detector X2200," Detector Electronics Corporation, 2 pages, 2014.
"UVIR Flame Detector X5200," Detector Electronics Corporation, 2 pages, 2014.
Yan et al., "Demonstration of the First 4F—SiC Avalanche Photodiodes," Solid State Electronics (44) pp. 341-346, 2000.

* cited by examiner

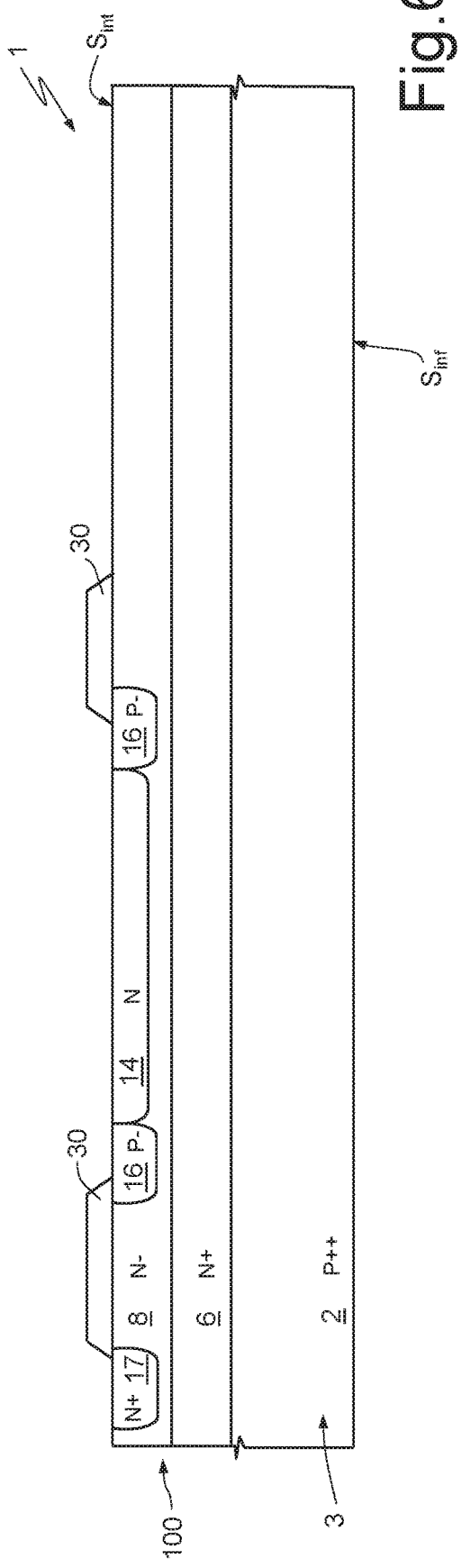
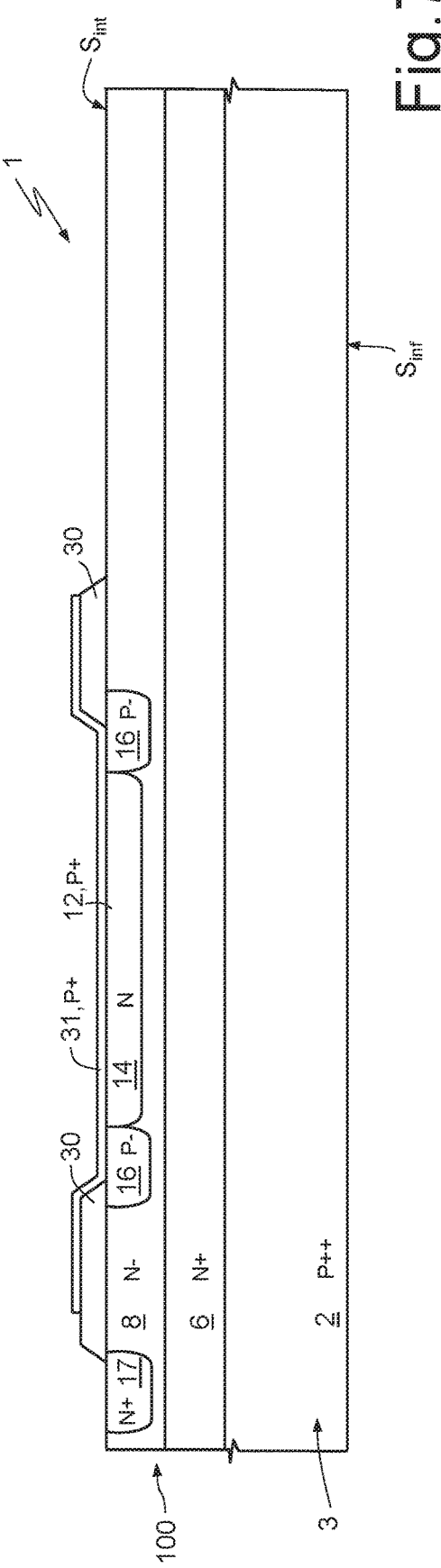

HIGH SENSITIVITY OPTOELECTRONIC DEVICE FOR DETECTING CHEMICAL SPECIES AND RELATED MANUFACTURING METHOD

BACKGROUND

Technical Field

The present disclosure relates to a high sensitivity optoelectronic device for detecting chemical species as well as to the related manufacturing method.

Description of the Related Art

As is known, in various fields of application there is today felt the need to detect one or more chemical species in particular in the gaseous phase, and hence determine the corresponding concentrations of such chemical species. For instance, in the field of the automotive industry, there is felt the need to determine the concentrations, within an exhaust gas, of chemical species that are generated in the course of the thermal reactions that occur within an engine. In this connection, it is known that, following upon a reaction of combustion that takes place between the fuel and the air, water ($H_2O$) and pollutant chemical species, such as carbon dioxide ($CO_2$), carbon monoxide (CO), sulphur oxides ($SO_x$), nitrogen oxides ($NO_x$), hydrocarbons (HC), and particulate matter (PM), are generated. In turn, nitrogen oxides include nitrogen monoxide (NO), nitrogen dioxide ($NO_2$), and dinitrogen monoxide ($N_2O$).

Once again by way of example, there is today felt the need to have available sensors that enable detection of volatile organic compounds (VOCs), which are highly pollutant, in order to detect the quality of the air. In this connection, volatile organic compounds comprise, among other things, the so-called aromatic polycyclic hydrocarbons (APHs), the latter being notoriously dangerous for human health.

Irrespective of the field of application, and hence of the particular chemical species that are to be measured, various detection methods have been developed, which broadly speaking may be divided into: i) methods based upon detection of the variations of an electrical quantity of a sensitive element, following upon interaction between the sensitive element and the chemical species under examination; and ii) methods based upon detection of variations of quantities of a non-electrical type, such as acoustic quantities, optical quantities, etc.

Considering merely sensors that are based upon the variation of an electrical characteristic of a sensitive element thereof, they are characterized by low costs and by a certain simplicity of construction; however, they are likewise characterized by a not particularly high sensitivity. In this connection, the sensitivity is limited, inter alia, also by the fact that, generally, said sensors generate the respective output signals without implementing amplification mechanisms.

BRIEF SUMMARY

The aim of the present disclosure is hence to provide an optoelectronic device for detecting chemical species that will solve at least in part the drawbacks of the prior art.

According to the present disclosure, a semiconductor device and a manufacturing method are provided, as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 6-14 are schematic cross-sectional views of a detection device, during successive steps of a manufacturing method.

DETAILED DESCRIPTION

The present optoelectronic device is based upon the principle of operation of Geiger mode avalanche photodiodes (GMAPs), also known as single-photon avalanche diodes (SPADs), in so far as they are able, at least theoretically, to ensure detection of individual photons.

In detail, it is known that a SPAD comprises a junction made of semiconductor material, which has a breakdown voltage $V_B$ and is biased, in use, at a reverse-biasing voltage $V_A$ higher in modulus than the breakdown voltage $V_B$. In this way, the junction presents a particularly extensive depleted region, present in which is a non-negligible electrical field. Hence, generation of a single electron-hole pair, caused by absorption within the depleted region of a photon incident on the SPAD, may be sufficient for triggering an ionization process. This ionization process in turn causes an avalanche multiplication of the carriers, with gains of around $10^6$, and consequent generation in short times (hundreds of picoseconds) of the so-called avalanche current, or more precisely of a pulse of the avalanche current.

The avalanche current can be collected by means of an external circuitry connected to the junction and represents a signal generated by the SPAD, also referred to as "output current". In practice, for each photon absorbed, a pulse of the output current of the SPAD is generated.

The fact that the reverse-biasing voltage $V_A$ is higher, in modulus, than the breakdown voltage $V_B$ causes the avalanche-ionization process, once triggered, to be self-sustaining. Consequently, once the avalanche-ionization process has been triggered, the SPAD is no longer able to detect photons, with the consequence that, in the absence of appropriate remedies, the SPAD manages to detect arrival of a first photon, but not arrival of subsequent photons. To be able to detect also the subsequent photons, it is necessary to quench the avalanche current generated within the SPAD, thus arresting the avalanche-ionization process, and in particular lowering, for a period of time known as "hold-off time", the effective voltage $V_e$ across the junction, so as to inhibit the ionization process. For this purpose, there is known the use of so-called quenching circuits, which may be of an active or passive type. Then, the reverse-biasing voltage $V_A$ is restored in order to enable detection of a subsequent photon.

This having been said, the present applicant has noted how it is possible to modify the structure of a SPAD so as to achieve the possibility of modulating the shape of the time plot of the pulses of the avalanche current as a function of the concentration of a chemical species under examination.

Figure 1:
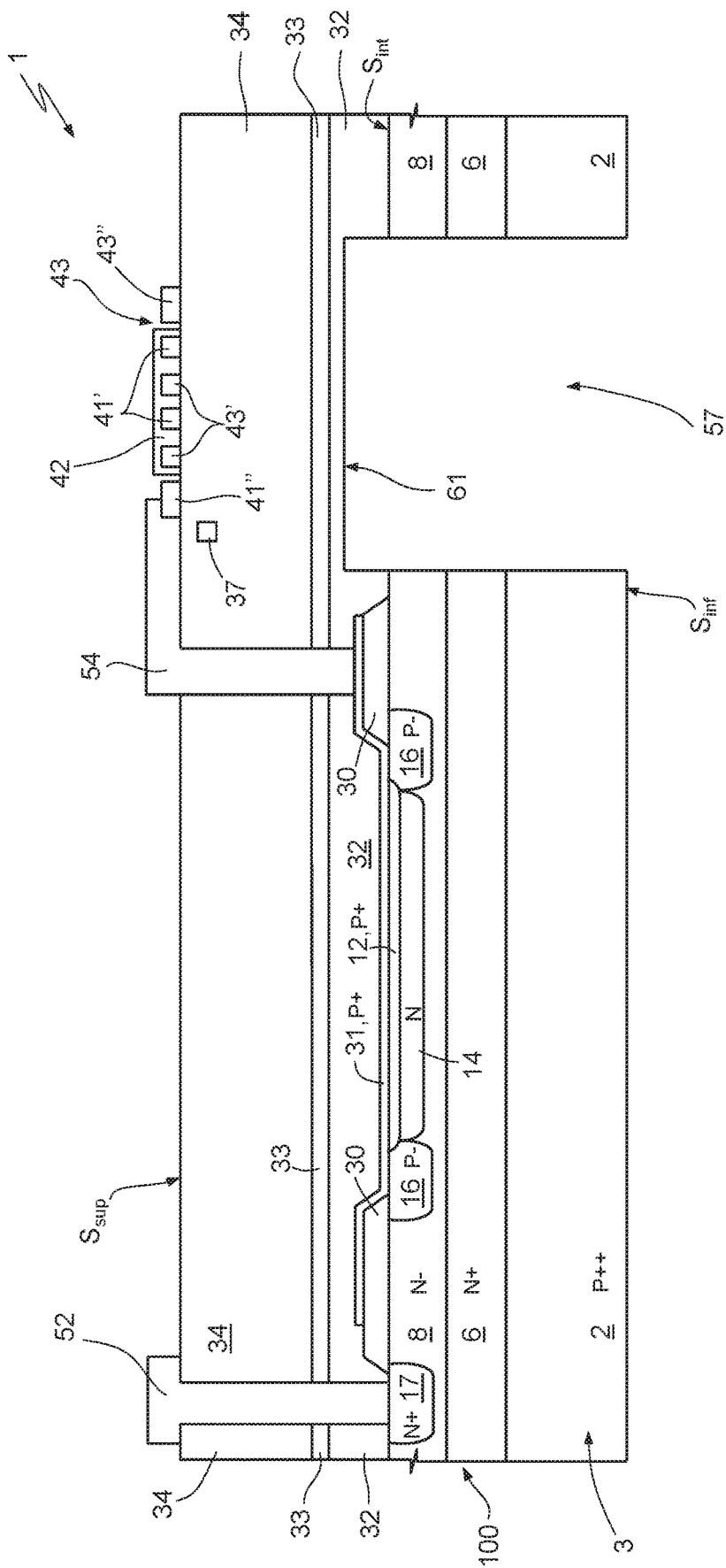
FIG. 1 is a schematic a cross sectional view of an embodiment of the present detection device.
Figure 2:
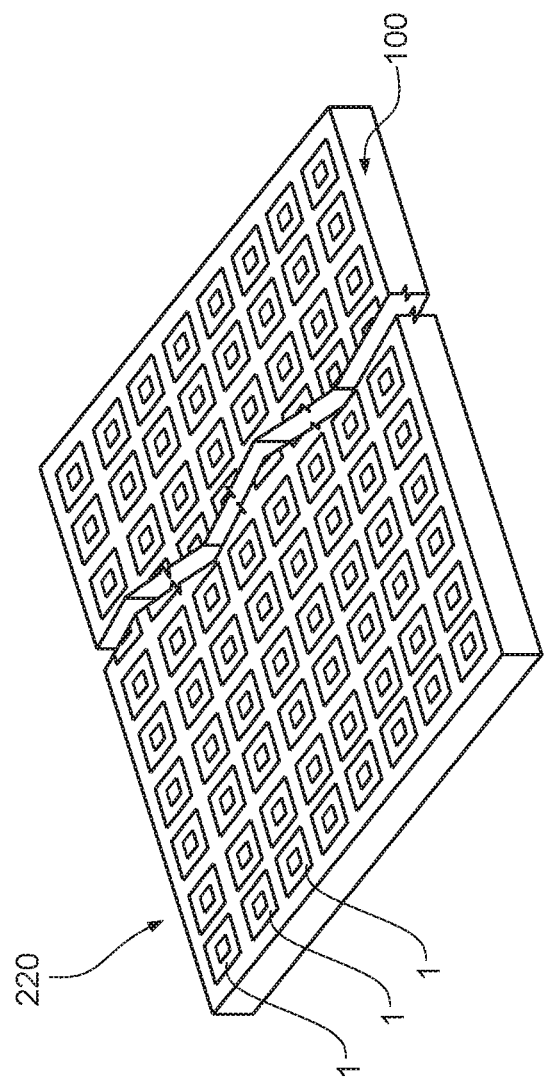
FIG. 2 is a schematic perspective view of an array of detection devices.

In greater detail, FIG. 1 shows a detection device 1, which is integrated in a die 100 of semiconductor material. As illustrated in FIG. 2, the detection device 1 may form part of an array 220 of detection devices that are the same as one another, all designated by 1.

In detail, the detection device 1 comprises a semiconductor body 3, which is made, for example, of silicon and in turn comprises a substrate 2, delimited by a bottom surface $S_{inf}$. Moreover, the detection device 1 includes a first epitaxial layer 6 and a second epitaxial layer 8. In FIG. 1, the thicknesses of the substrate 2 and of the first and second epitaxial layers 6, 8 are not in scale, as neither are the thicknesses of the other regions, described hereinafter.

The substrate 2 is of an N++ type, has a thickness of, for example, between 300 μm and 500 μm, and has a doping level of, for example, between $1 \cdot 10^{19}$ cm$^{-3}$ and $1 \cdot 10^{20}$ cm$^{-3}$.

The first epitaxial layer 6 is of an N+ type, has a thickness of, for example, between 4 μm and 8 μm and overlies, in direct contact, the substrate 2. Moreover, the first epitaxial layer 6 has a doping level of, for example, between $1 \cdot 10^{16}$ cm$^{-3}$ and $5 \cdot 10^{16}$ cm$^{-3}$.

The second epitaxial layer 8 is of an N-type, has a thickness of, for example, between 3 μm and 5 μm and overlies the first epitaxial layer 6, with which it is in direct contact. Moreover, the second epitaxial layer 8 has a doping level of, for example, between $1 \cdot 10^{14}$ cm$^{-3}$ and $3 \cdot 10^{14}$ cm$^{-3}$. Moreover, the second epitaxial layer 8 forms an intermediate surface $S_{int}$, which delimits the semiconductor body 3 at the top.

An anode region 12, of a P+ type, which has, in top plan view, a circular or polygonal (for example, quadrangular) shape, gives out onto the intermediate surface $S_{int}$ and extends in the second epitaxial layer 8. In particular, the anode region 12 has a thickness of, for example, between 0.05 μm and 0.4 μm; moreover, the anode region 12 has a doping level of, for example, between $1 \cdot 10^{18}$ cm$^{-3}$ and $1 \cdot 10^{19}$ cm$^{-3}$.

An enriched region 14, of an N type, extends in the second epitaxial layer 8, underneath, and in direct contact with, the anode region 12. In top plan view, the enriched region 14 has a circular or polygonal (for example, quadrangular) shape; moreover, the enriched region 14 has a thickness of, for example, 1 μm and a doping level of, for example, between $1 \cdot 10^{16}$ cm$^{-3}$ and $5 \cdot 10^{16}$ cm$^{-3}$.

For practical purposes, the anode region 12 and the enriched region 14 form a first PN junction, designed to receive photons and generate the avalanche current. The enriched region 14 and the second epitaxial layer 8 have, instead, the purpose of confining a high electrical field in the proximity of the first PN junction, reducing the breakdown voltage $V_B$ of the junction itself.

A guard ring 16 having a circular shape, of a P-type and with a doping level of between $1 \cdot 10^{16}$ cm$^{-3}$ and $3 \cdot 10^{16}$ cm$^{-3}$, extends in the second epitaxial layer 8; in particular, the guard ring 16 gives out onto the intermediate surface $S_{int}$ and is arranged on the outside of the anode region 12, with which it is in direct contact. Moreover, the guard ring 16 has a thickness of, for example, between 1 μm and 3 μm.

The guard ring 16 forms a second PN junction with the second epitaxial layer 8 so as to prevent edge breakdown of the anode region 12.

The semiconductor body 3 further comprises a contact region 17, which extends in the second epitaxial layer 8, starting from the intermediate surface $S_{int}$. The contact region 17 is of an N+ type and has a doping level of between $1 \cdot 10^{19}$ cm$^{-3}$ and $1 \cdot 10^{20}$ cm$^{-3}$. Moreover, the contact region 17 extends on the outside of the guard ring 16 and at a distance from the latter.

The detection device 1 further comprises a first dielectric region 30, which extends on the intermediate surface $S_{int}$, is made, for example, of thermal oxide and has a thickness of, for example, 0.8 μm. In particular, the first dielectric region 30 has a hollow shape so as to define a recess that leaves the anode region 12 exposed. In other words, whereas the anode region 12 gives out onto a central portion of the intermediate surface $S_{int}$, the first dielectric region 30 extends on a peripheral portion of the intermediate surface $S_{int}$. Moreover, the first dielectric region 30 extends partially over the guard ring 16, with which it is in direct contact.

The detection device 1 further comprises a region 31, referred to hereinafter as the intermediate region 31.

In detail, the intermediate region 31 is made, for example, of polysilicon, is of a P+ type, has a doping level of between $1 \cdot 10^{20}$ cm$^{-3}$ and $3 \cdot 10^{20}$ cm$^{-3}$ and has a thickness of, for example, between 50 nm and 100 nm. Moreover, the intermediate region 31 extends, in direct contact, on the first dielectric region 30 and on the anode region 12, as well as on the guard-ring portion 16 left exposed by the first dielectric region 30.

In greater detail, and without this implying any loss of generality, the intermediate region 31 extends on a central portion of the first dielectric region 30, which defines the aforementioned recess, whereas it leaves an outer portion of the first dielectric region 30 exposed. This outer portion of the first dielectric region 30 in part overlies the contact region 17, with which it is in direct contact.

The detection device 1 further comprises a second dielectric region 32, which extends, in direct contact, on the intermediate region 31, as well as on the outer portion of the first dielectric region 30, left exposed by the intermediate region 31. Moreover, the second dielectric region 32 is made, for example, of TEOS oxide and has a thickness of, for example, between 0.8 μm and 2 μm.

The detection device 1 further comprises a third dielectric region 33 and a fourth dielectric region 34.

The third dielectric region 33 extends over the second dielectric region 32, in direct contact therewith. Moreover, the third dielectric region 33 is made, for example, of silicon nitride ($Si_3N_4$) and has a thickness of, for example, between 0.8 μm and 2 μm. The third dielectric region 33 is optional and performs the task of reducing the mechanical surface stresses.

The fourth dielectric region 34 extends, in direct contact, on the third dielectric region 33 and is delimited at the top by a top surface $S_{sup}$. Moreover, the fourth dielectric region 34 is made, for example, of TEOS oxide and has a thickness of, for example, between 0.8 μm and 2 μm.

The detection device 1 further comprises a heater 37, made, for example, of platinum and having a serpentine shape (in top plan view). The heater 37 extends in the fourth dielectric region 34, at a distance from the third dielectric region 33 and from the top surface $S_{sup}$.

The detection device 1 further comprises a first electrode 41 and a second electrode 43, and a sensitive region 42.

In detail, the first and second electrodes 41, 43 are made, for example, of platinum and extend on the top surface $S_{sup}$, in direct contact with the fourth dielectric region 34.

Figure 3:
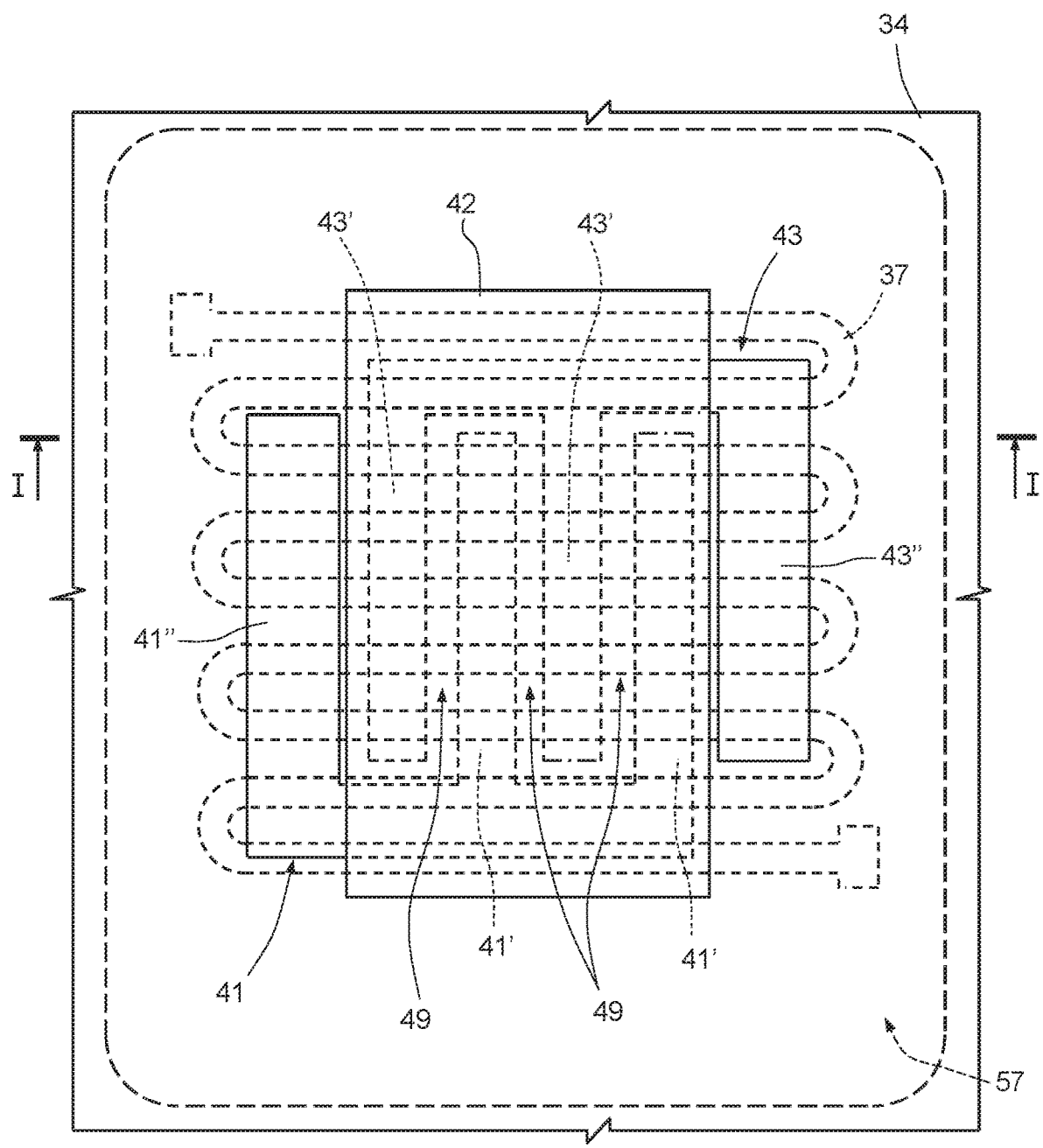
FIG. 3 is a schematic top plan view with portions removed of a part of the embodiment illustrated in FIG. 1.

As illustrated in greater detail in FIG. 3, the first and second electrodes 41, 43 each comprise a respective plurality of elongated elements, designated, respectively, by 41' and 43'. Moreover, the elongated elements 41', 43' of the first and second electrodes 41, 43 are parallel to one another and are arranged in a comb-fingered way. The first and second electrodes 41, 43 hence laterally delimit a plurality of gaps 49, each gap 49 being delimited laterally by a respective pair of elongated elements and being delimited at the bottom by the fourth dielectric region 34.

In greater detail, each of the first and second electrodes 41, 43 has a comb shape. Moreover, the first electrode 41 comprises a terminal portion 41", arranged on one side with respect to the elongated elements 41'. Likewise, the second electrode 43 has a respective terminal portion 43", which is arranged on one side with respect to the elongated element 43'. Without this implying any loss of generality, the terminal portions 41", 43" are arranged on opposite sides with respect to the ensemble formed by the elongated elements 41', 43' of the first and second electrodes 41, 43.

The detection device 1 further comprises a sensitive region 42, which extends on the elongated elements 41', 43' of the first and second electrodes 41, 43 and fills the aforementioned gaps 49, contacting the fourth dielectric region 34. In top plan view, the sensitive region 42 is, for example, quadrangular.

In greater detail, and without this implying any loss of generality, the sensitive region 42 entirely fills the gaps 49 and overlies the elongated elements 41', 43' of the first and second electrodes 41, 43. The terminal portions 41", 43" of the first and second electrodes 41, 43 are laterally staggered with respect to the sensitive region 42 and are hence left exposed by the latter.

Yet in greater detail, assuming that the detection device 1 is configured to detect the concentration of a given chemical species (for example, in the fluid state, such as a volatile organic compound) that is in contact with the sensitive region 42, the sensitive region 42 is formed by any material that is able to exhibit a variation of its own resistivity following upon interaction with the aforementioned chemical species. In greater detail, the sensitive region 42 may be made, for example, of an oxide of a metal material ("metal oxide", MOX), such as $TiO_2$, $V_2O_5$, $WO_3$, $SnO_2$, ZnO, $Fe_2O_3$. In general, the resistivity of the sensitive region 42 varies at least by 1% for a variation in concentration of 100 ppm. For instance, in the case where the sensitive region 42 is made of $SnO_2$, and on the hypothesis that the chemical species to be detected is ethanol, the resistivity of the sensitive region 42 is found to vary approximately by 10% for a variation in ethanol concentration of 100 ppm.

Without this implying any loss of generality, the material that forms the sensitive region 42 may be porous or nanostructured in order to increase sensitivity.

The detection device 1 further comprises a cathode metallization 52, made of metal material, which extends through the second, third, and fourth dielectric regions 32, 33, 34, until it comes into contact with the contact region 17.

The detection device 1 further comprises an anode metallization 54, made of metal material, which extends through the second, third, and fourth dielectric regions 32, 33, 34, until it comes into contact with the intermediate region 31. In particular, without this implying any loss of generality, the anode metallization 54 contacts a portion of the intermediate region 31 arranged on top of a corresponding portion of the first dielectric region 30. Moreover, the anode metallization 54 contacts the terminal portion 41" of the first electrode 41.

The detection device 1 further comprises a cavity 57, which extends through the semiconductor body 3, starting from the bottom surface $S_{inf}$. In particular, the cavity 57 traverses the substrate 2 and the first and second epitaxial layers 6, 8; moreover, the cavity 57 is laterally staggered with respect to the first dielectric region 30, since it is arranged on the outside of the latter. The cavity 57 hence extends through a bottom portion of the second dielectric region 32, at a distance from the third dielectric region 33.

In greater detail, the heater 37 is laterally staggered with respect to the first dielectric region 30, as well as with respect to the anode metallization 54, and is arranged so as to overlie, at a distance, the cavity 57. Moreover, also the first and second electrodes 41, 43 are arranged so as to overlie, at a distance, the cavity 57.

As illustrated once again in FIG. 3, at least part of the serpentine of the heater 37 extends underneath the sensitive region 42.

In practice, a portion of the second dielectric region 32 delimits the cavity 57 at the top, forming a wall 61. In addition, this portion of the second dielectric region 32 forms, together with the portions of the third and fourth dielectric regions 33, 34 arranged on top of the wall 61, a membrane, within which the heater 37 extends, and on top of which the first and second electrodes 41, 43 and the sensitive region 42 extend. The heater 37 is electrically insulated from the anode region 12 and from the sensitive region 42.

For practical purposes, the first and second epitaxial layers 6, 8 and the enriched region 14 form a cathode region. Moreover, the sensitive region 42 forms a resistor with variable resistance (as a function of the concentration of the chemical species to be detected), which is electrically interposed between the first and second electrodes 41, 43. In turn, the first electrode 41 is electrically connected to the anode region 12. The sensitive region 42 is hence connected in series to the Geiger mode photodiode formed by the anode region 12 and by the aforementioned cathode region.

In use, the heater 37 is subjected to a voltage of, for example, 2 V, for instance by means of a first external circuitry (not illustrated), coupled to the heater 37 via corresponding contacts (not illustrated). In this way, by the Joule effect the heater 37 reaches a temperature for example of between 50° C. and 500° C. Thanks to the insulation provided by the air present in the underlying cavity 57, the increase in temperature of the heater 37 leads to a corresponding increase in temperature of the sensitive region 42; in this way, occurrence of redox reactions between the sensitive region 42 and the chemical species to be detected is favored, with consequent increase in sensitivity.

The cathode metallization 52 may be set at ground. The second electrode 43 is, instead, set, via a second external circuitry (not illustrated), at a reverse-biasing voltage $V_A$ equal, in modulus, to the breakdown voltage $V_B$ of the junction present between the anode region 12 and the cathode region, plus a voltage $V_{OV}$, of, for example, -3 V.

In the absence of the avalanche current, no current flows in the sensitive region 42, which is hence all at one and the same voltage, equal at the reverse-biasing voltage $V_A$. Following upon triggering of the avalanche current (generated, for example, following upon absorption of a photon), within the sensitive region 42 a voltage drop occurs on account of the flow of the avalanche current within the sensitive region 42. In particular, whereas the portion of sensitive region 42 that contacts the second electrode 43 remains at the reverse-biasing voltage $V_A$, the portion of sensitive region 42 that contacts the first electrode 41 is at a voltage approximately equal to the breakdown voltage $V_B$. Moreover, the sensitive region 42 functions as quenching resistor, and hence enables quenching of the avalanche current. Following upon quenching of the avalanche current, the sensitive region 42 returns to having all one and the same voltage, equal to the reverse-biasing voltage $V_A$. From another standpoint, the anode region 12 recharges to the reverse-biasing voltage $V_A$, with a timing that depends, inter alia, upon the value of resistance of the sensitive region 42.

The sensitive region 42 hence functions as sensitive structure, which interacts chemically with the chemical species to be detected, with consequent variation of its own resistance as a function of the concentration of the chemical species to be detected. The variation of resistance of the sensitive region 42 in turn affects the shape of the avalanche-current pulses, as illustrated, for example in FIG. 4. In the absence of the chemical species to be detected, the value of resistance of the sensitive region 42 may, for example, be approximately 100 MΩ.

Figure 4:
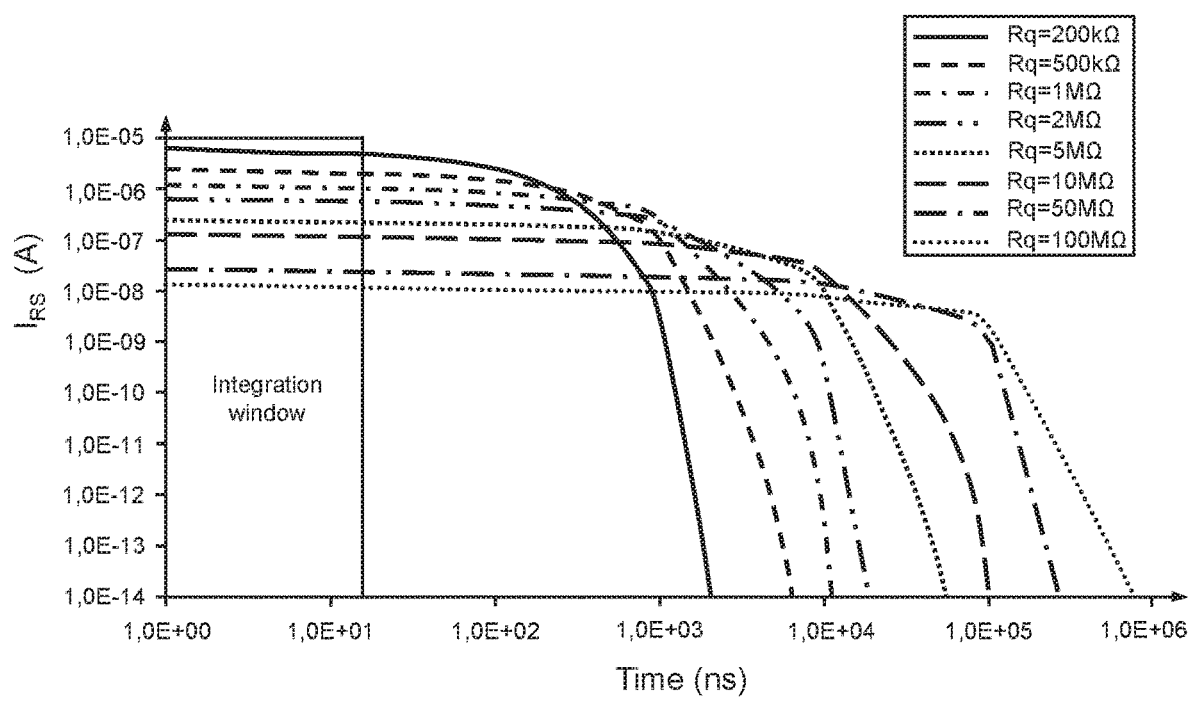
FIG. 4 shows time plots of current pulses corresponding to different values of the resistance of a sensitive region of the present detection device.

In detail, FIG. 4 shows the time plots (in logarithmic scale) of the avalanche current (which is also in logarithmic scale and is denoted by $I_{Rs}$) that is generated within the detection device 1, for example following upon absorption of a photon, for different values of resistance of the sensitive region 42 (denoted by $R_q$). In particular, it may be noted how, as the value of resistance of the sensitive region 42 increases, there is a reduction of the peak value of the avalanche current, which is reaches in a very short time, following upon triggering (in FIG. 4, the step of growth of the value of the avalanche current, which precedes reaching of the peak, is not visible). In addition, there is an increase in the duration of the recharging time. In other words, as the concentration of the chemical species varies, there is a variation of the resistance of the sensitive region 42, which causes a corresponding modulation of the profile of the pulse of the avalanche current in the recharging region. The detection device 1 hence functions as electrical transducer of the concentration of the chemical species to be detected.

As illustrated once again in FIG. 4, and as described in greater detail hereinafter, modulation of the shape of the pulse of the avalanche current can be exploited for determining the concentration of the chemical species to be detected. More in particular, it is possible to exploit the variation of the charge that can be obtained by integrating the avalanche current in a time interval having fixed duration (in the example illustrated in FIG. 4, of 10 ns) and starting from triggering of the avalanche phenomenon. Also this charge, in fact, varies as a function of the resistance of the sensitive region 42, and hence as a function of the concentration of the chemical species to be detected. In this connection, it may be noted that the profile of the plot of the avalanche current in the period that elapses between triggering and reaching of the peak, as likewise in the quenching period, has a low dependence upon the value of resistance of the sensitive region 42; moreover, the charge contribution in this period is negligible.

In use, turning-on of a detection device 1 does not alter, to a first approximation, biasing of the adjacent detection devices 1. Consequently, the array 220 forms a so-called silicon photomultiplier (SiPM), i.e., an array of SPADs (in the case in point, the detection devices 1), grown on one and the same substrate and provided with respective quenching resistors decoupled from and independent of one another. Moreover, the detection devices 1 are connected to one and the same voltage generator (not illustrated) so as to be biased at the aforementioned reverse-biasing voltage $V_A$. The avalanche currents generated within the detection devices 1 are multiplexed together so as to generate a signal at output from the SiPM, referred to hereinafter as "array signal". The array signal is equal to the summation of the output signals of the SPADs, which are formed by the avalanche currents. The array signal is hence proportional, to a first approximation, to the number of photons that impinge upon the array 220. As regards the time plot of the array signal, the same considerations made in connection with FIG. 4 apply.

Figure 5:
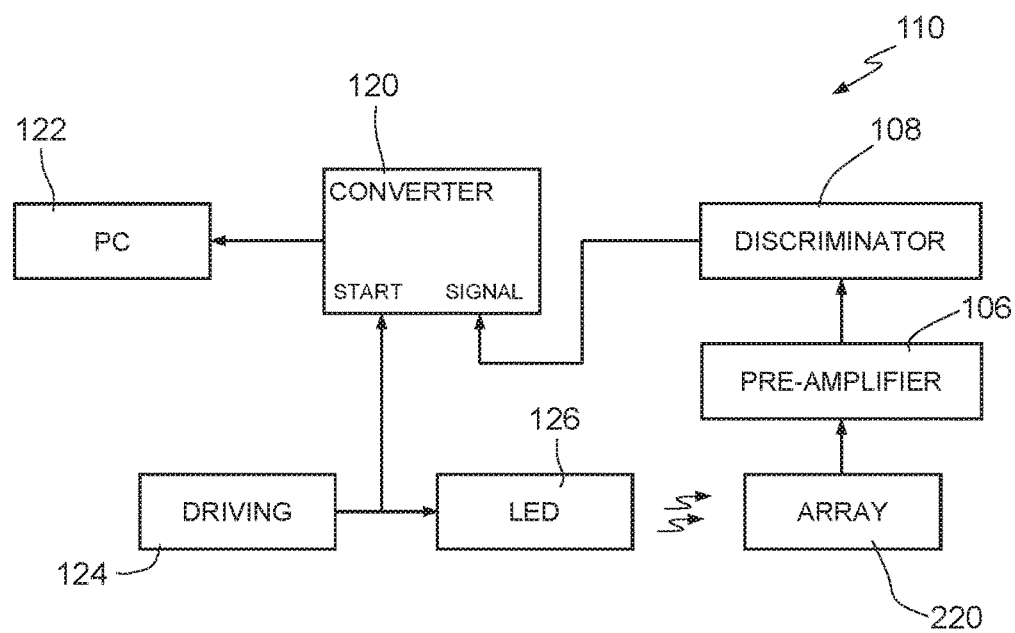
FIG. 5 shows a block diagram of a system for detecting chemical species.

All this having been said, it is possible to make use of the detection system 110 illustrated in FIG. 5, which comprises, in addition to the array 220, appropriately supplied by a corresponding power-supply stage (not illustrated), also a pre-amplifier 106 (optional), a discriminator 108, a converter 120, and a computer 122. Moreover, the detection system 110 comprises a driving stage 124 and an optical source 126, constituted, for example, by a LED.

The array 220 is electrically connected to the input of the pre-amplifier 106, the output of which is connected to the input of the discriminator 108; a first output of the discriminator 108 is connected to a first input terminal SIGNAL of the converter 120. The output of the driving stage 124 is connected to the optical source 126 and to a second input terminal START of the converter 120, the output of which is connected to the computer 122.

In use, the driving stage 124 controls the optical source 126 so as to generate optical pulses, which are received by the array 220, which, as has been said, generates the aforementioned array signal. For this purpose, the driving stage 124 generates on its own output a timing signal, which comprises a plurality of corresponding pulses, referred to hereinafter as "emission pulses". In practice, for each emission pulse, the optical source 126 generates a corresponding optical pulse.

The pre-amplifier 106 amplifies the array signal, generating a pre-amplified signal.

The discriminator 108 compares the pre-amplified signal, and in particular the corresponding pulses, with a threshold, filtering the pulses that do not exceed said threshold. In greater detail, the discriminator 108 generates a filtered signal, which comprises just the pulses of the pre-amplified signal that exceed the threshold so as to filter, for example, the so-called dark pulses.

If the electrical pulses of the filtered signal are referred to as "detection pulses", it is found that to each emission pulse there can correspond a detection pulse. In the case where to a given emission pulse there corresponds a respective detection pulse, it means that a photon of the optical pulse emitted by the optical source 126 and corresponding to the given emission pulse has been detected by the array 220. Moreover, the detection pulse is delayed with respect to the emission pulse.

The converter 120 generates an integration signal of a digital type, as a function of the timing signal and of the filtered signal. The integration signal represents, for each emission pulse that has been detected by the array 220, the integral of the current of the filtered signal, in a time window that starts, for example, with the rising edge of the corresponding emission pulse, and has a fixed duration (for example, of between 5 ns and 100 ns). In other words, the integration signal represents the charge carried by the filtered signal during the aforementioned time window.

In greater detail, with reference once again to FIG. 4, it may be noted how, assuming a sufficiently small integration time window, there is a reduction in the integrated charge as the value of resistance of the sensitive region 42 increases. In this connection, according to the material that forms the sensitive region 42, the resistance of the sensitive region 42 may increase or else decrease as the concentration of the chemical species to be detected increases. This having been said, the time window may be chosen in way such that it terminates at least 50 ns before the point at which the current-time curve corresponding to the case where the chemical species is absent drops by 20% with respect to the corresponding peak value.

In other words, assuming, for example, that the sensitive region 42 is made of a material such that, as the concentration of the chemical species to be detected increases, if there is a reduction in resistance, the amount of charge integrated in the aforementioned time window increases as the concentration of the chemical species increases. Consequently, if the concentration of the chemical species exceeds a certain value, the value of resistance of the sensitive region 42 is no longer sufficient to quench the avalanche current. This phenomenon, which is not described further, can be used to detect, for example, a potentially dangerous condition.

Once again with reference to the computer 122, this calculates an estimate of the concentration of the chemical species to be detected, on the basis of the integration signal and, for example, of a calibration curve. For instance, the calibration curve, stored in the computer 122, has been determined experimentally and correlates values of charge with corresponding values of concentration of the chemical species to be detected. The present detection device 1 may be produced following the manufacturing method that is described hereinafter.

As illustrated in FIG. 6, formed in a way in itself known are the substrate 2, the first and second epitaxial layers 6, 8, the enriched region 14, the guard ring 16, the contact region 17, and the first dielectric region 30.

Next, as illustrated in FIG. 7, the intermediate region 31 is formed, for example by means of a process of deposition of a polysilicon layer doped in situ and a subsequent photolithographic process.

Figure 8:
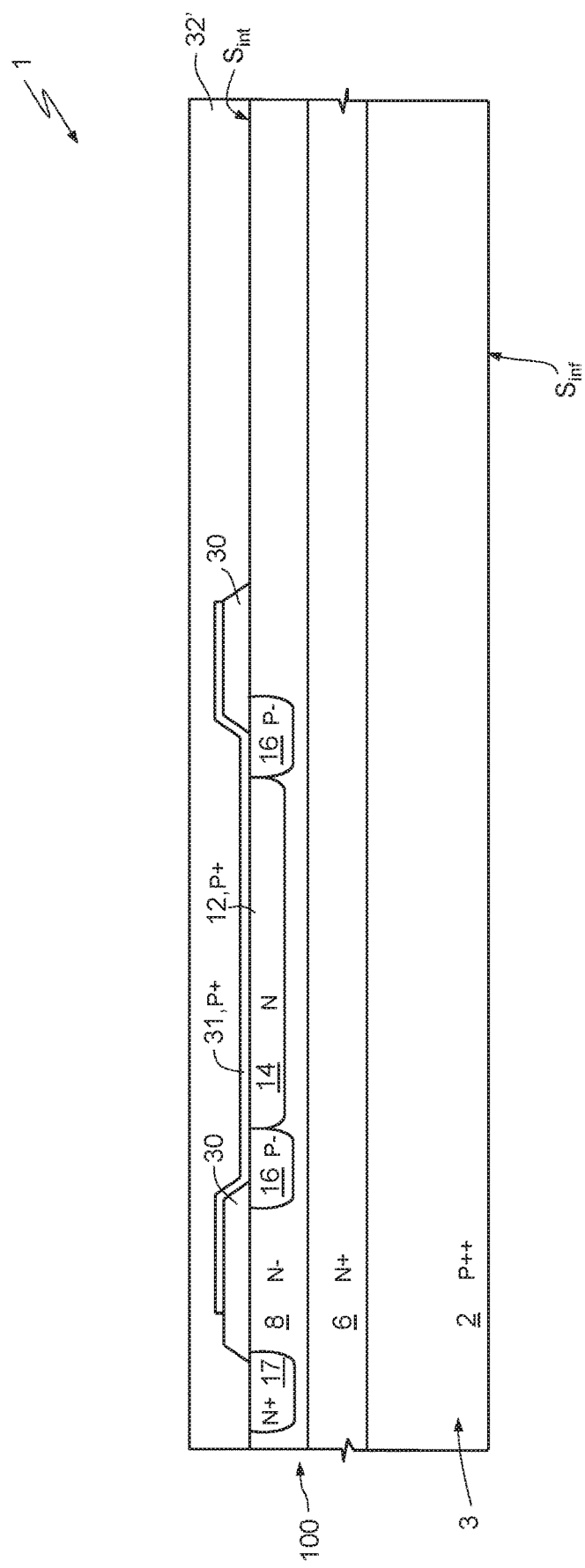

Then, as illustrated in FIG. 8, formed by deposition is a layer 32', referred to hereinafter as the first process layer 32'. The first process layer 32' is to form the second dielectric region 32. For example, the first process layer 32' is made of TEOS oxide and has a thickness of, for example, 1.2 µm.

Figure 9:
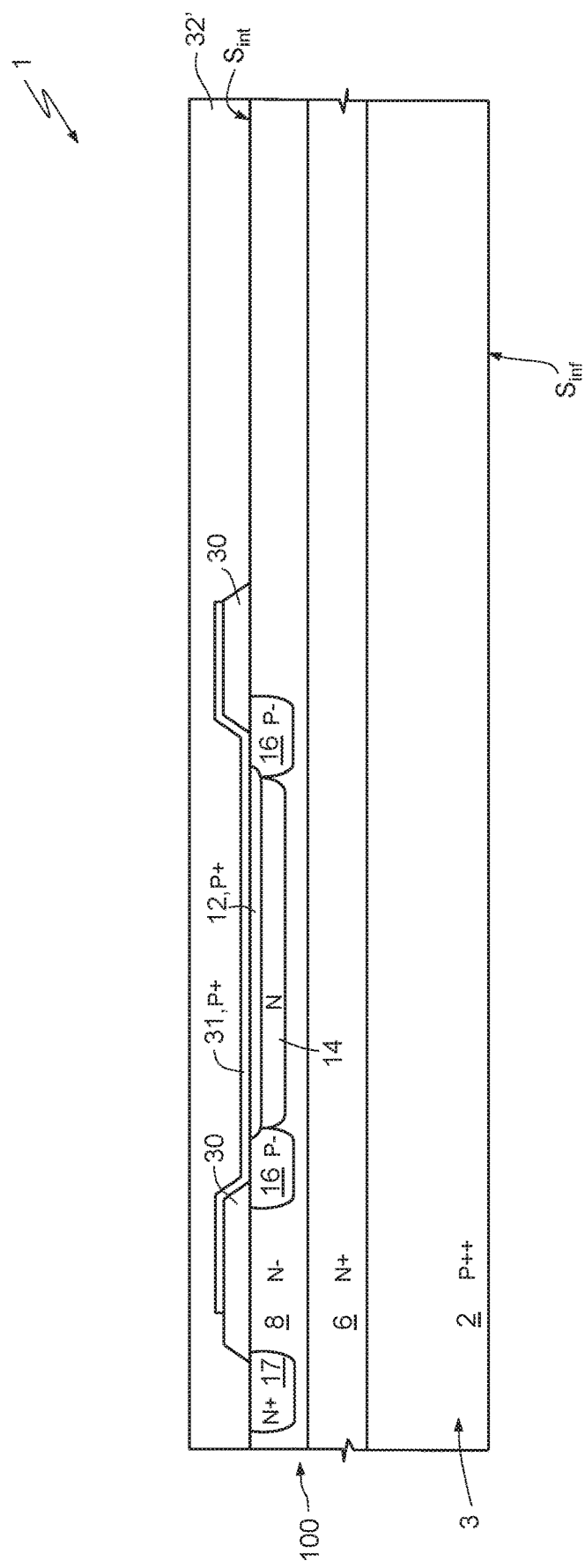

Next, as illustrated in FIG. 9, a thermal annealing is carried out at a temperature of, for example, 1000° C., and with a duration of, for example, two minutes. The aforesaid annealing causes formation of the anode region 12 by diffusion starting from the intermediate region 31.

Figure 10:
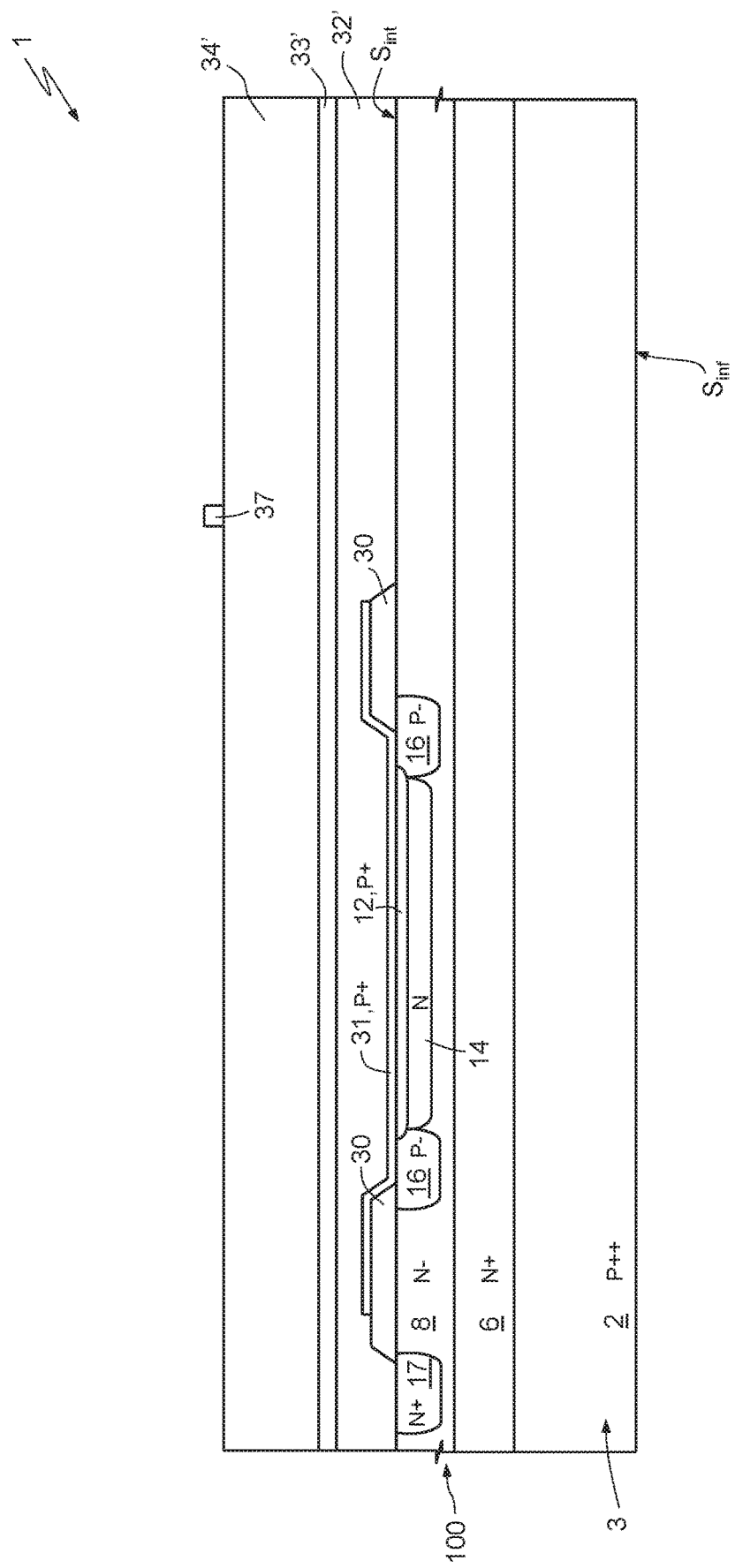

Then, as illustrated in FIG. 10, two depositions of dielectric material (for example, silicon nitride and TEOS oxide) are carried out in succession so as to form a second process layer 33' and a third process layer 34', which are to form, respectively, the third and fourth dielectric regions 33, 34. Moreover, formed on the third process layer 34' is the heater 37, for example by means of a process of deposition of metal material and a subsequent photolithographic process.

Figure 11:
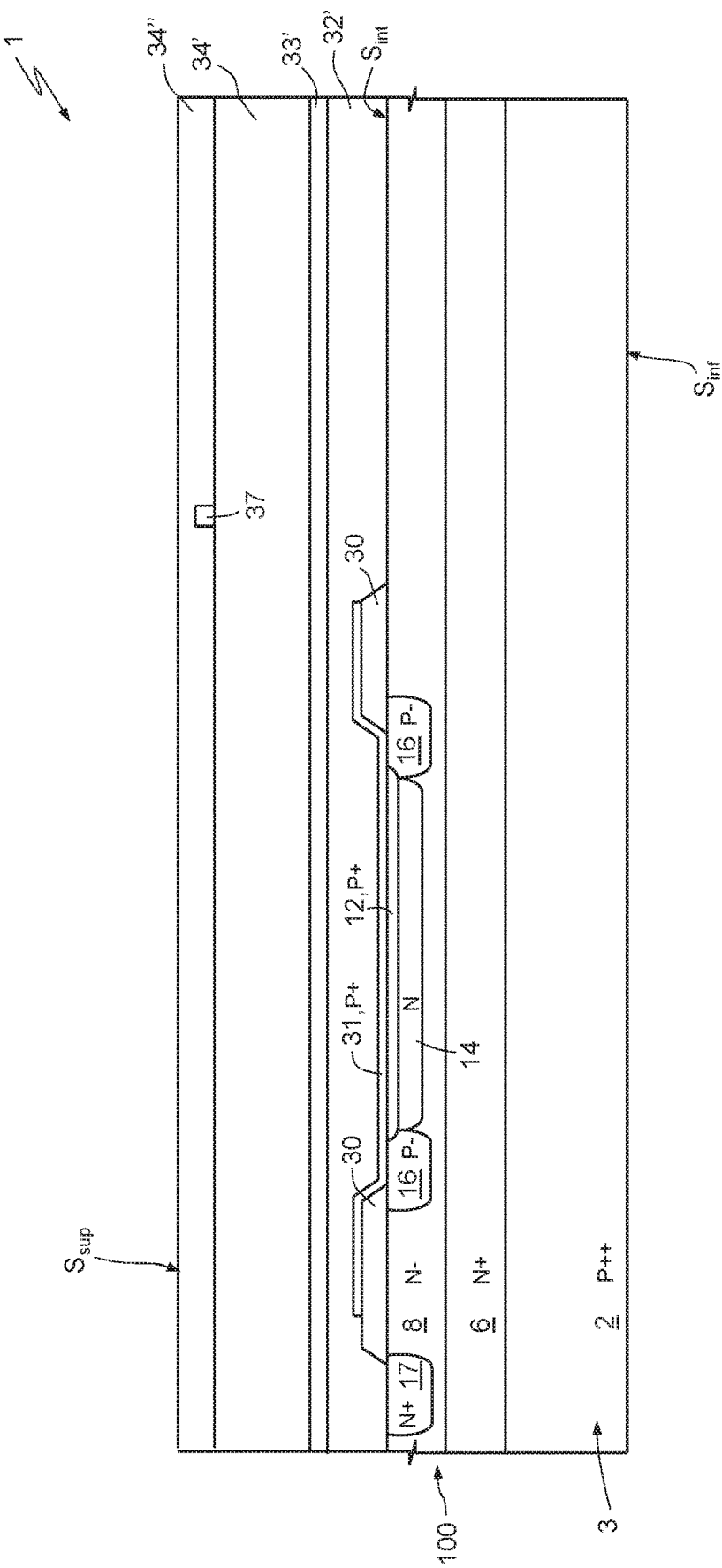

Next, as illustrated in FIG. 11, a further process of deposition of dielectric material (for example, TEOS oxide) is carried out so as to form a fourth process layer 34" on the heater 37 and on the portions of the third process layer 34' left exposed by the heater 37.

Figure 12:
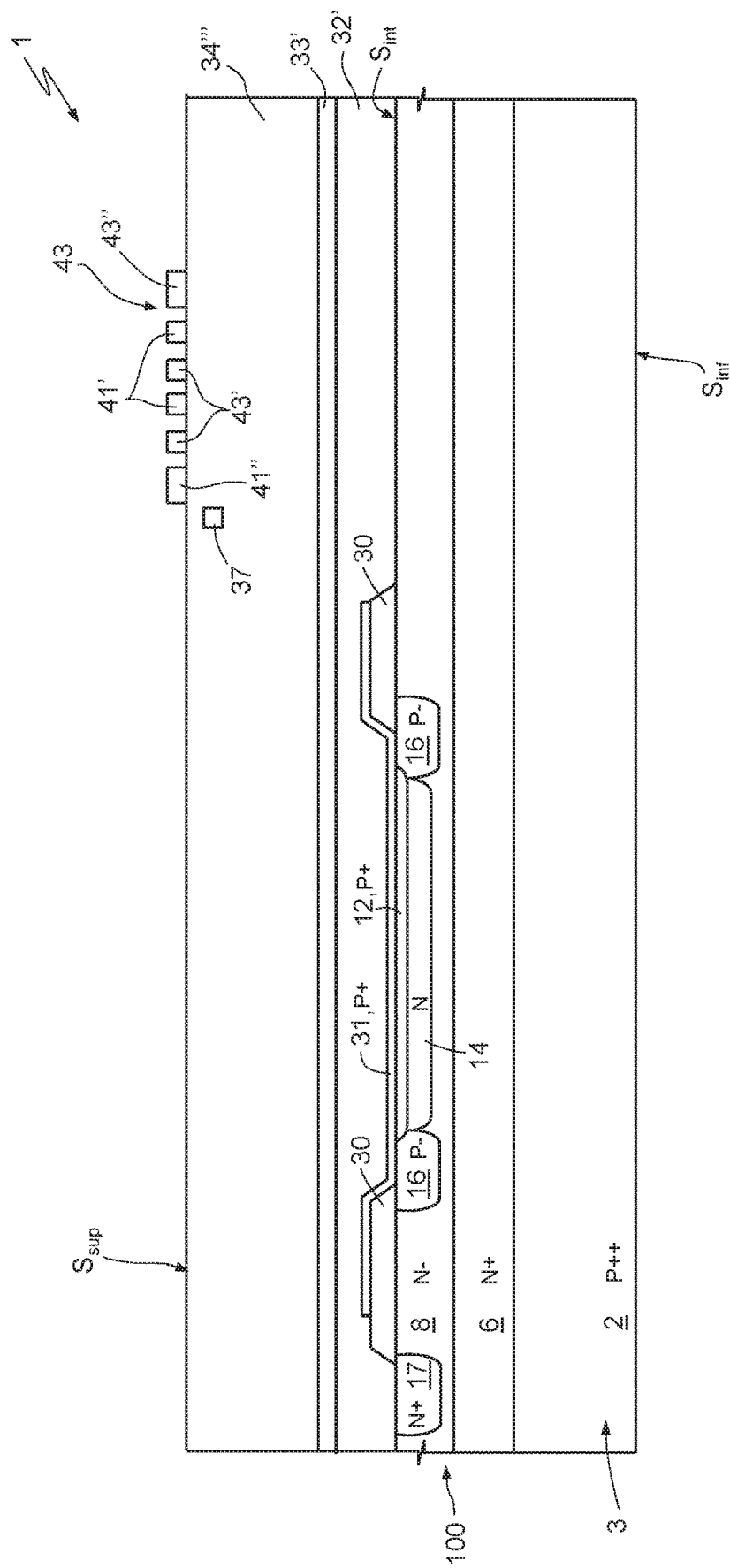

As illustrated in FIG. 12, the third and fourth process layers 34', 34" form a single region, referred to hereinafter as the process region 34'''. The process region 34''' is to form the fourth dielectric region 34 and is delimited at the top by the top surface $S_{sup}$.

As illustrated once again in FIG. 12, the first and second electrodes 41, 43 are then formed on the top surface $S_{sup}$, for example by means of a corresponding process of deposition of metal material and a subsequent corresponding photolithographic process.

Figure 13:
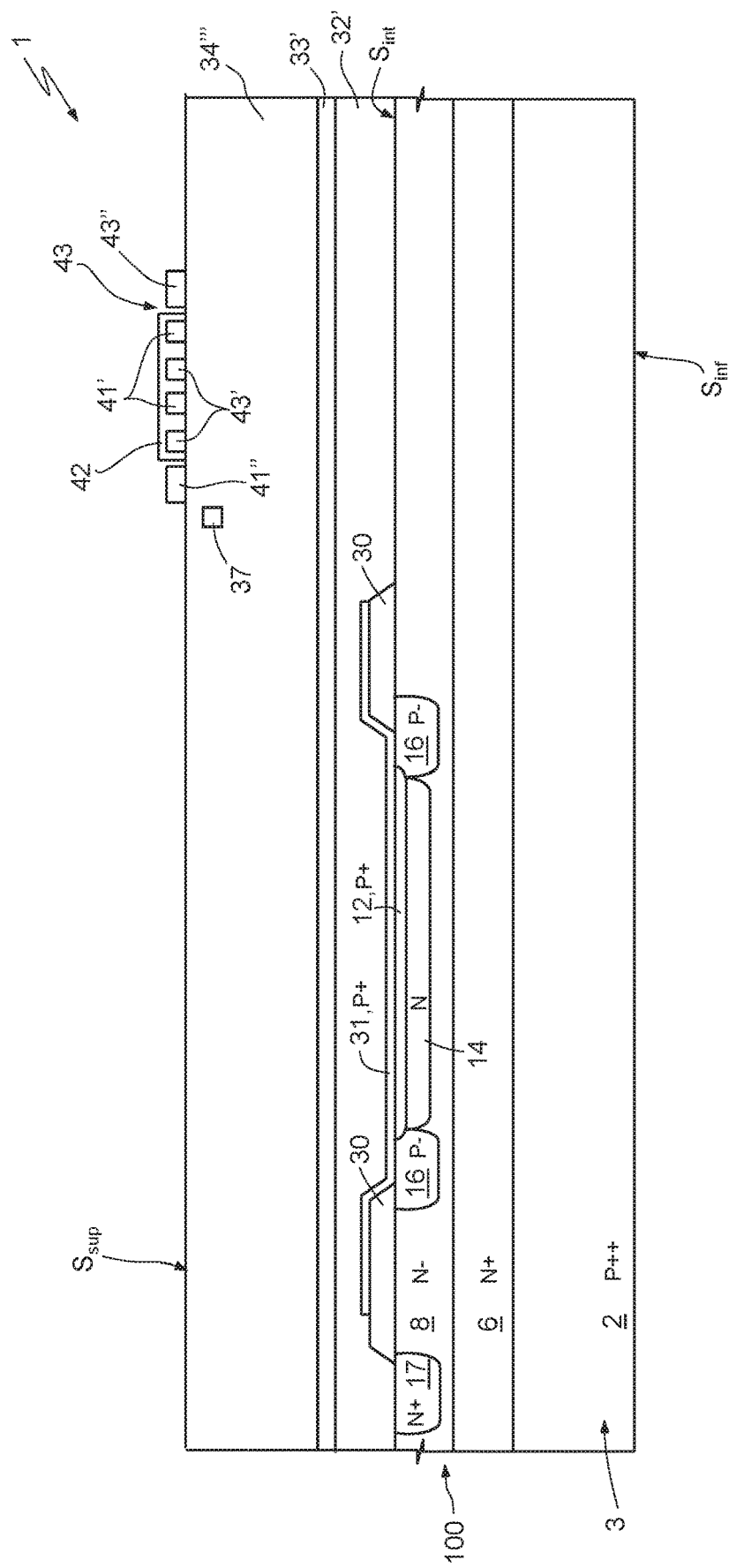

Next, as illustrated in FIG. 13, the sensitive region 42 is formed, for example by deposition of a resist, followed by a photomasking process, a process of deposition of a metal oxide, and then a lift-off process, and finally a thermal annealing (for example in air, at 700° C. and with a duration of 1 h) in order to sinter the metal oxide that has remained.

Figure 14:
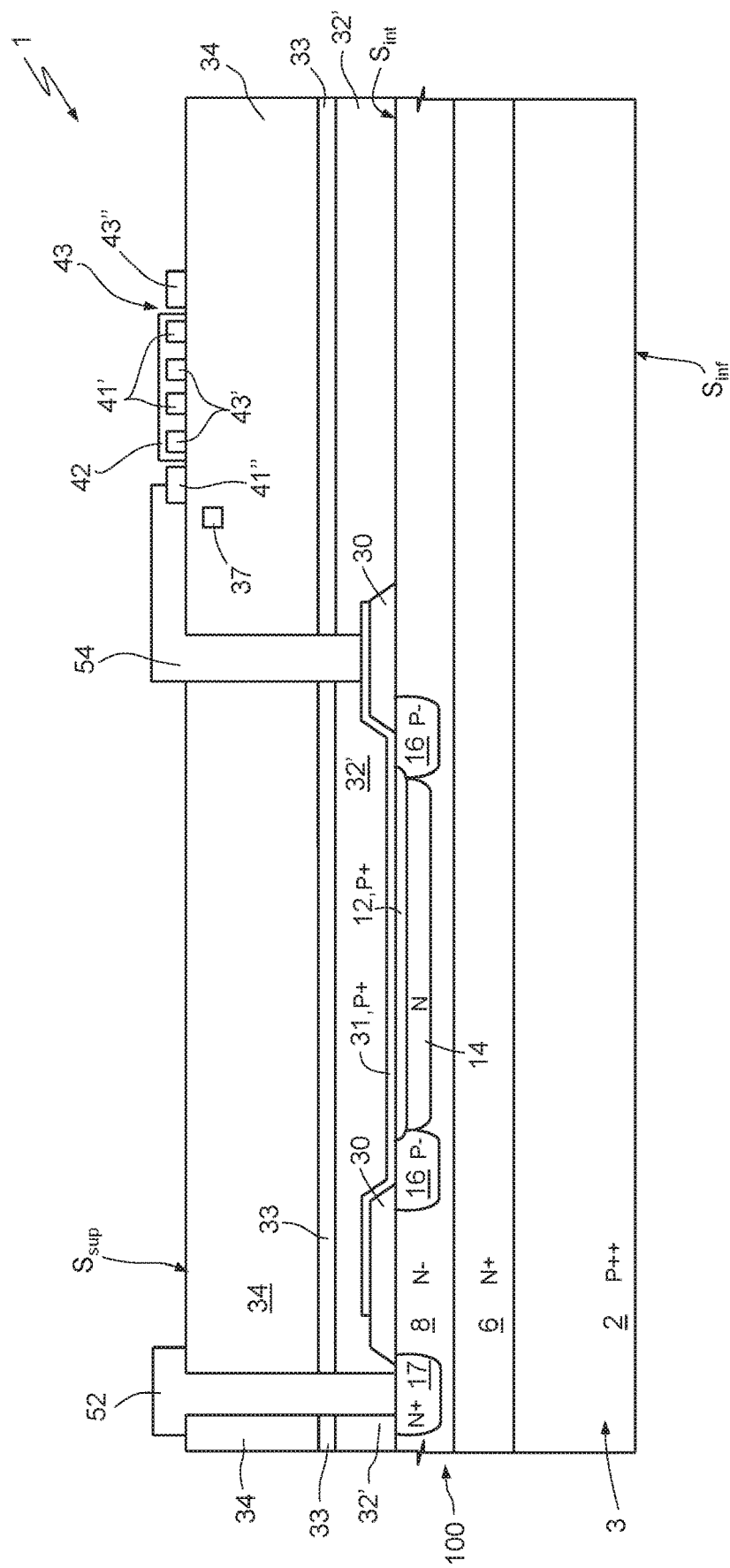

Then, as illustrated in FIG. 14, the anode metallization 52 and the cathode metallization 54 are formed in a way in itself known. This step entails selective removal of portions in the process region 34''' and of the first and second process layers 32', 33'. The remaining portions of the process region 34''' and of the second process layer 33' form the fourth and third dielectric regions 34, 33, respectively.

Finally, an etch (for example, a dry etch) is carried out to remove semiconductor material selectively, starting from the bottom surface $S_{inf}$, and to form the cavity 57, thus obtaining what is illustrated in FIG. 1. This etch leads, inter alia, to selective removal of a portion of the first process layer 32'; the remaining portion of the first process layer 32' forms the second dielectric region 32.

From what has been described and illustrated previously, the advantages that the present solution affords are evident.

In particular, the present device enables detection of the concentration of a chemical species, with a high sensitivity. In this connection, thanks to the presence of a Geiger mode diode, the present detection device implements within it a gain mechanism. Moreover, the present detection device can easily be produced by means of standard technological processes.

Finally, it is clear that modifications and variations may be made to what has been described and illustrated herein, without thereby departing from the sphere of protection of the present disclosure.

For instance, embodiments are possible in which the first electrode 41 and/or the second electrode 43 have shapes and/or arrangements different from what has been described. However, the comb-fingered arrangement of the first and second electrodes 41, 43 enables reduction of the value of resistance of the sensitive region 42.

The sensitive region 42 may have a shape different from what has been described. For instance, it may extend also on at least one of the terminal portions 41", 43" of the first and second electrodes 41, 43.

The semiconductor body 3 may have a composition different from what has been described. For instance, the substrate 2 may be of an N type. Moreover, the semiconductor body 3 may be made of a semiconductor different from silicon, such as silicon carbide.

The heater 37 may be absent, even though it enables increase in sensitivity of the detection device 1.

The cathode metallization may be arranged underneath the semiconductor body 3.

Also the manufacturing method may differ from what has been described. Purely by way of example, the anode region 12 may be formed by implantation instead of by diffusion.

Finally, all the types of doping may be reversed with respect to what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for detecting a chemical species, comprising:
   a body of semiconductor material having a front surface;
   a first Geiger mode avalanche photodiode including:
      a cathode region having a first type of conductivity in the body, which forms the front surface; and
      an anode region having a second type of conductivity in the body, which extends in the cathode region starting from the front surface;
   a dielectric region which extends on the front surface;
   a first electrode on the dielectric region and electrically coupled to the anode region;
   a second electrode on the dielectric region; and
   a sensitive region on and interposed between the first and second electrodes, the sensitive region having a resistance that depends upon a concentration of said chemical species.

2. The detection device according to claim 1, further comprising a heater element configured to generate heat and arranged within the dielectric region, underneath the sensitive region.

3. The detection device according to claim 2, wherein the semiconductor body has a bottom surface; said detection device further comprising a cavity, which extends through the semiconductor body, starting from the bottom surface, and through a portion of the dielectric region, said sensitive region being overlaid on said cavity.

4. The detection device according to claim 1, wherein the second electrode is configured to bias the Geiger mode avalanche photodiode when the second electrode is biased.

5. The detection device according to claim 4, wherein the first and second electrodes are arranged in a comb-fingered way.

6. The detection device according to claim 1, wherein the sensitive region is made of a metal oxide.

7. The detection device according to claim 1, further comprising an intermediate semiconductor region having the second type of conductivity, which is interposed between the anode region and the dielectric region; and wherein the sensitive region is electrically coupled to the anode region through the intermediate semiconductor region.

8. The device according to claim 1, wherein said first type of conductivity is a conductivity of an N type, and wherein said second type of conductivity is a conductivity of a P type.

9. The detection device according to claim 1, wherein the sensitive region is electrically interposed between the first and second electrodes.

10. A device, comprising:
    a die of semiconductor material having a front surface;
    an array of detection devices, each of the detection devices including:
       a first Geiger mode avalanche photodiode including:
          a cathode region having a first type of conductivity in the body, which forms the front surface; and
          an anode region having a second type of conductivity in the body, which extends in the cathode region starting from the front surface;
       a dielectric region which extends on the front surface;
       a first electrode on the dielectric region and electrically coupled to the anode region;
       a second electrode on the dielectric region; and
       a sensitive region on and interposed between the first and second electrodes, the sensitive region having a resistance that depends upon a concentration of said chemical species.

11. The device according to claim 10, wherein each detection device includes a heater element configured to generate heat and arranged within the dielectric region of the detection device, underneath the sensitive region of the detection device.

12. The device according to claim 11, wherein the semiconductor body has a bottom surface; each detection device further including a cavity, which extends through the semiconductor body, starting from the bottom surface, and through a portion of the dielectric region of the detection device, said sensitive region of the detection device being overlaid on said cavity.

13. The device according to claim 11, further comprising:
    an integration stage configured to generate an output signal indicating, for each electrical pulse of the timing signal, an integral of the corresponding current pulse in a time window, a start of which depends upon said electrical pulse, said time window having a fixed duration; and
    a processing stage configured to determine an estimate of the concentration of the chemical species based on said output signal.

14. A detection system comprising:
    a light source;
    a driving stage configured to control the light source with a timing signal including a plurality of electrical pulses so as to generate a plurality of optical pulses;
    a device configured to receive said optical pulses and generate a current signal including a plurality of corresponding current pulses, the device including:
    a die of semiconductor material having a front surface;
    an array of detection devices, each of the detection devices including:
       a first Geiger mode avalanche photodiode including:
          a cathode region having a first type of conductivity in the body, which forms the front surface; and
          an anode region having a second type of conductivity in the body, which extends in the cathode region starting from the front surface;
       a dielectric region which extends on the front surface;
       a first electrode on the dielectric region and electrically coupled to the anode region;
       a second electrode on the dielectric region; and
       a sensitive region on and interposed between the first and second electrodes, the sensitive region having a resistance that depends upon a concentration of said chemical species.

15. A method for manufacturing a device for detecting a chemical species, the method comprising:
    forming a Geiger mode avalanche photodiode in a body of semiconductor material delimited by a front surface, wherein forming the Geiger mode avalanche photodiode includes:
       forming a cathode region, having a first type of conductivity, in the body and extending from the front surface; and
       forming an anode region having a second type of conductivity, which extends in the cathode region starting from the front surface;
    forming a dielectric region on the front surface;
    forming a first electrode on the dielectric region, the first electrode being electrically coupled to the anode region;

forming a second electrode on the dielectric region; and forming a sensitive region on an interposed between the first and second electrodes, the sensitive region having a resistance that depends upon a concentration of said chemical species.

16. The manufacturing method according to claim 15, further comprising forming, within the dielectric region and underneath the sensitive region, a heater element configured to generate heat.

17. The manufacturing method according to claim 16, wherein the semiconductor body has a bottom surface, said method further comprising forming a cavity that extends through the semiconductor body, starting from the bottom surface, and through a portion of the dielectric region, said cavity being underneath the sensitive region.

18. The manufacturing method according to claim 15, wherein forming the first electrode and the second electrode comprises forming the first and second electrodes in a comb-fingered way.

19. The manufacturing method according to claim 15, further comprising forming, between the anode region and the dielectric region, an intermediate semiconductor region having the second type of conductivity, which is electrically interposed between the sensitive region and the anode region.

20. The manufacturing method according to claim 19, wherein forming the anode region comprises:

after carrying forming the cathode region, forming the intermediate semiconductor region; and carrying out a thermal annealing after forming the intermediate semiconductor region.

\* \* \* \* \*